US006979208B2

(12) United States Patent  
Xie et al.

(10) Patent No.: US 6,979,208 B2
(45) Date of Patent: *Dec. 27, 2005

(54) LAMINATED SOCKET CONTACTS

(75) Inventors: Hong Xie, Phoenix, AZ (US); Ram Viswanath, Phoenix, AZ (US); Pr Patel, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/922,581

(22) Filed: Aug. 19, 2004

(65) Prior Publication Data

US 2005/0085106 A1    Apr. 21, 2005

Related U.S. Application Data

(63) Continuation of application No. 10/324,534, filed on Dec. 19, 2002, now Pat. No. 6,854,979.

(51) Int. Cl.[7] ........................................... H01R 13/648
(52) U.S. Cl. ........................................ 439/101; 439/70
(58) Field of Search ............................. 439/70, 71, 101, 439/108, 342; 361/780, 794; 174/255

(56) References Cited

U.S. PATENT DOCUMENTS

| 4,814,857 | A | 3/1989 | Werbizky |
| 5,104,327 | A | 4/1992 | Walburn |
| 5,483,099 | A | 1/1996 | Natarajan et al. |
| 5,714,801 | A | 2/1998 | Yano et al. |
| 5,825,084 | A | 10/1998 | Lau et al. |
| 5,864,478 | A | 1/1999 | McCutchan et al. |
| 5,892,275 | A | 4/1999 | McMahon |
| 6,328,574 | B1 | 12/2001 | Howell et al. |
| 6,392,306 | B1 | 5/2002 | Khandros et al. |
| 6,437,431 | B1 | 8/2002 | Mbouombouo et al. |
| 6,479,758 | B1 | 11/2002 | Arima et al. |
| 6,495,911 | B1 | 12/2002 | Buffet et al. |
| 6,521,846 | B1 | 2/2003 | Freda et al. |
| 6,558,169 | B2 * | 5/2003 | Figueroa et al. ............... 439/70 |
| 6,575,766 | B1 * | 6/2003 | Xie et al. ...................... 439/70 |
| 6,600,220 | B2 | 7/2003 | Barber et al. |
| 6,854,979 | B2 * | 2/2005 | Xie et al. ...................... 439/40 |

FOREIGN PATENT DOCUMENTS

| JP | 62113608 | 11/1998 |
| WO | WO 02/054487 A2 | 7/2002 |

* cited by examiner

Primary Examiner—Thanh-Tam Le
(74) Attorney, Agent, or Firm—Blakely, Sokoloff, Taylor & Zafman LLP

(57) ABSTRACT

A laminated socket contact is described for reducing inductance in power connections to an integrated circuit package. The contact consists of a conductive power panel, a conductive ground panel, a thin non-conductive layer interposed between the power panel and ground panel layer, and at least one conductive finger extending from each of the power panel and ground panel. Various embodiments of this socket contact may be used with power bar connectors, side terminal connectors or pin connectors.

18 Claims, 11 Drawing Sheets

LAMINATED SOCKET CONTACTS

RELATED APPLICATIONS

This continuation patent application claims priority to non-provisional U.S. patent application Ser. No. 10/324,534, entitled "Laminated Socket Contacts", filed on Dec. 19, 2002, now U.S. Pat. No. 6,854,979 which is now allowed, further claiming priority to U.S. patent application Ser. No. 10/082,881, entitled "Laminated Socket Contacts", filed Feb. 26, 2002, issued on Jun. 10, 2003 as U.S. Pat. No. 6,575,766.

FIELD OF THE INVENTION

The invention relates generally to the field of integrated circuit socket design. More particularly, the invention relates to a laminated socket contact that reduces the inductance of the package/sockets by reducing the distance between power and ground conductors of the contact.

BACKGROUND OF THE INVENTION

Various methods of mounting integrated circuit packages onto printed circuit boards have been developed. For example, common methods employ some form of socket, mounted onto a printed circuit board, into which the integrated circuit package is placed. Pins on the integrated circuit package mate with corresponding receptacles in the socket. Through these pins, power, ground, input, and output signals are supplied to the integrated circuit.

Improvements to the various types of sockets used to mount integrated circuit packages have focused on reducing the amount of electrical resistance presented by the contacts within the sockets. Various improvements have focused on increasing the contact area and/or the contact pressure in order to provide low resistance connections.

However, the power and ground connection points of these various types of sockets are relatively far apart and the conductors carrying the current are relatively long. This distance between connection points and length of conductor increase the amount of inductance in the conductors.

BRIEF DESCRIPTION OF THE DRAWINGS

The appended claims set forth the features of the invention with particularity. The invention, together with its advantages, may be best understood from the following detailed description taken in conjunction with the accompanying drawings of which:

DETAILED DESCRIPTION OF THE INVENTION

A laminated socket contact is described for reducing inductance in power connections to an integrated circuit package. Broadly stated, embodiments of the present invention seek to provide a more efficient power socket by reducing the distance between the power and ground contacts. According to one embodiment, the contact consists of a conductive power panel, a conductive ground panel, a thin non-conductive layer interposed between the power panel and ground panel layer, and at least one conductive finger extending from each of the power panel and ground panel. Various embodiments of this socket contact may be used with power bar connectors, side terminal connectors or pin connectors.

In the following description, for the purposes of explanation, numerous specific details are set forth in order to provide a thorough understanding of the present invention. It will be apparent, however, to one skilled in the art that the present invention may be practiced without some of these specific details. In other instances, well-known structures and devices are shown in block diagram form.

Importantly, while embodiments of the present invention will be described with reference to power bar connectors and side terminal connectors for integrated circuit (IC) packages, the method and apparatus described herein are equally applicable to other types of connectors used for electrically connecting an integrated circuit package to a socket. For example, the techniques described herein are thought to be useful in connection with traditional integrated sockets using pin receptacles such as the 478 sockets manufactured by Intel Corporation of Santa Clara Calif. for use with that company's P4 processors.

Figure 1:
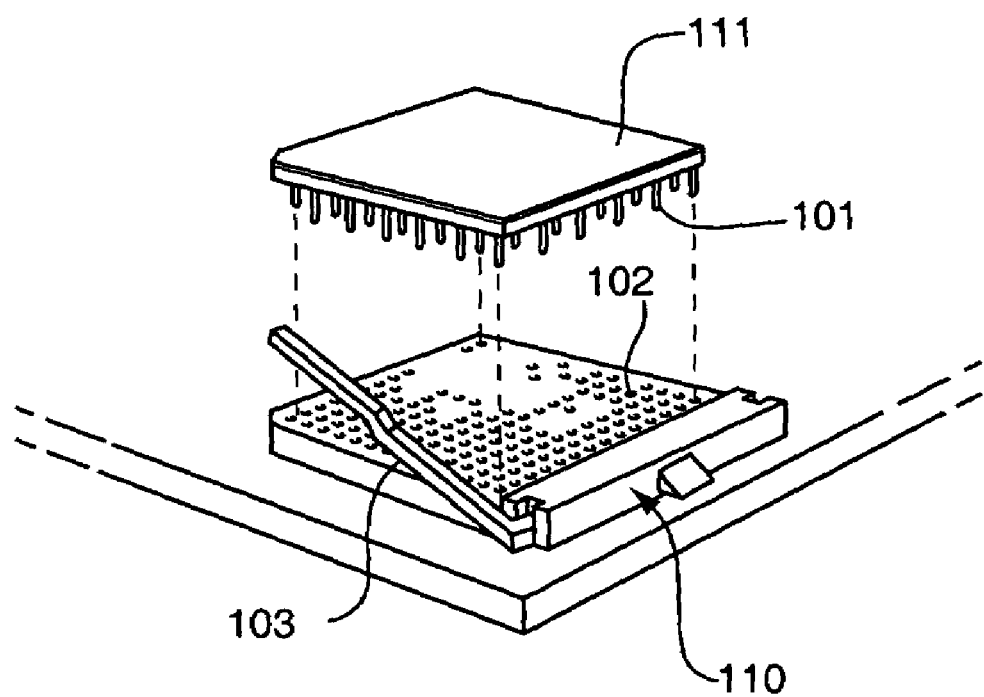
FIG. 1 is a high level illustration of a typical socket and integrated circuit package.

FIG. 1 is a high level illustration of a typical socket and integrated circuit package. This example illustrates an integrated circuit package 111 having a number of pins 101 for providing electrical connection between the integrated circuit package 111 and a socket 110. When connecting the integrated circuit package 111 to the socket 110, all of the package pins 101 are inserted into and engage a socket's pin receptacles 102. A lever 103 is used for locking the package pins 101 into place and forcing contact between the pins 101 and their corresponding receptacles 102.

The pin size has been reduced over time due to chip complexity, solder re-flow and packaging advances such as surface mount technology (SMT). Increased functionality has resulted in increased power demands by the IC device to the point where power and ground must be supplied through multiple pins. However, the pin size and the contacts between the socket pin receptacle and the package pin limit the power that may be supplied to an IC from an IC board. Additionally, the individual pins cause high non-uniform current distribution between the different pins that are utilized to supply the power to the IC package. On solution to these problems is the use of a power bar for supplying power and ground connections to the IC package.

Figure 2:
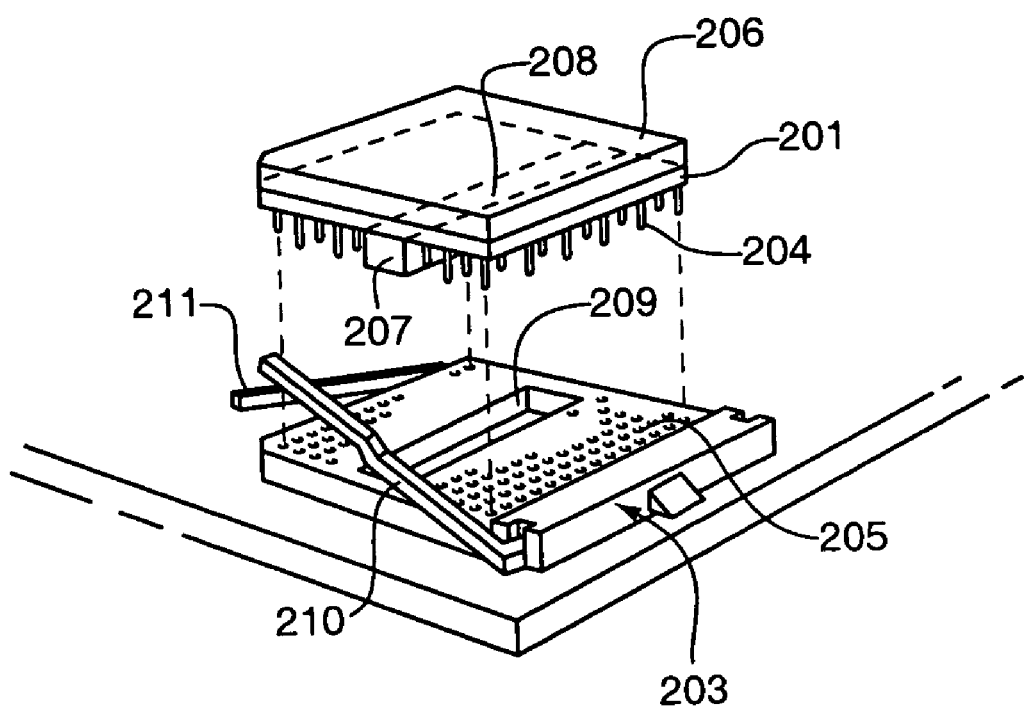
FIG. 2 is a high level illustration of a socket and integrated circuit package having a power bar.

FIG. 2 is a high level illustration of a socket and integrated circuit package having a power bar. In this example, an IC package 201 having a power plane (not shown) is mounted into a socket 203. The IC package 201 has multiple input/output pins 204 that are inserted into corresponding socket holes 205 for transferring and receiving informational input/output (I/O) signals necessary for the proper functional operation of the IC chip 206 integrated with the IC package 201. Although other electrically conductive materials may be used, in this example a Copper (Cu) power bar 207 is connected to the power plane 202 along its entire adjacent border 208 and extrudes from the IC package to be inserted into a corresponding power bar carrier 209 incorporated in the socket 203. This power bar provides common connection points for all power and ground inputs to the IC chip 206. A locking mechanism 210 is employed to force the I/O the pin receptacle contacts to make contact with their corresponding pins, while a second locking mechanism 211 may be employed to separately lock the power bar carrier to the power bar.

Figure 3A:
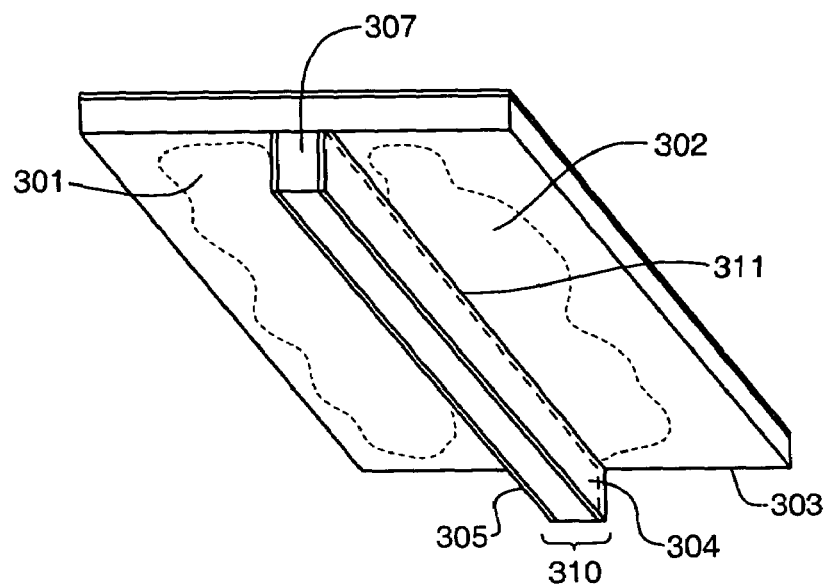
FIGS. 3a and 3b illustrate an integrated circuit package having a power bar.
Figure 3B:
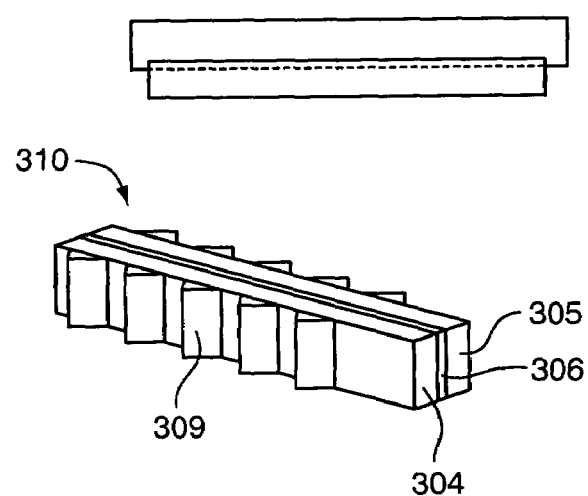

FIGS. 3a and 3b illustrate an integrated circuit package having a power bar. Although various planes or cross planes may exist in the package for holding the power and ground for the IC, FIG. 3a demonstrates two power planes, one for holding a first voltage level and one for holding a second voltage level. For simplicity these voltages levels will be referred to as power and ground. Arbitrarily, the power plane 301 resides above the ground plane 302 although it is well understood that location is irrelevant. Additionally, a plane in this context is one level of copper although a plane that is not restricted to copper or a single level is contemplated. For example, a ground plane could be constructed of any conducting material and spread among several levels in the IC package 303. The ground power plane's extrusion panel 304 could connect directly to one or more of the ground planes along its entire adjacent edge 311 to the ground plane.

In this example, a power bar 310 comprises two power plane extrusion panels 304 and 305 that are separated by an insulating buffer panel 306 for protecting the integrity of the power signals to be delivered by preventing short circuiting. The ground power plane extrusion panel 304 is connected along its entire adjacent bordering edge 311 to the ground power plane 302 by solder or equivalent while the power plane extrusion panel 305 is connected along its entire adjacent bordering edge to the power plane 301 via solder or equivalent. An insulation barrier panel 307 along the perpendicular circumference of the power plane extrusion panel 305 isolates the power plane extrusion panel 305 from the ground plane 302 where the power plane extrusion panel 305 penetrates or passes through the ground plane 302.

Each power or ground extrusion panel 304 or 305 of the power bar 310 may have various contact extrusions, bumps or ridges to enable intentional engaging of the IC package power bar to a socket. In this example, several protrusions in the form of regularly spaced bumps or ridges 309 are integrally connected and formed as part of the power or ground extrusion panels to assist in the intentional engaging or locking in place of the IC package power bar to the socket carrier.

The power bar removes the inherent limitations of transferring power to an IC through pins by providing a larger surface and contact area. The increased surface and contact area provides substantial power delivery capabilities while also providing a uniform delivery mechanism that reduces resistance and inductance caused by multiple pins.

Figure 4:
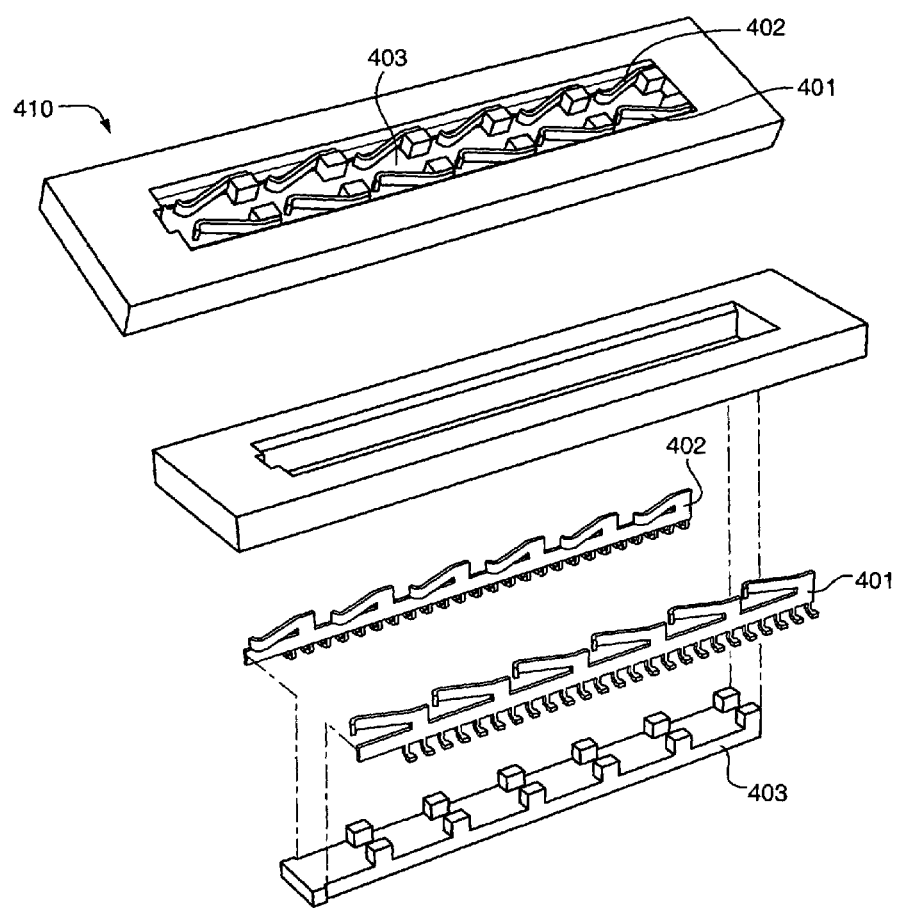
FIG. 4 illustrates a socket for mounting an integrated circuit with a power bar.
Figure 4:
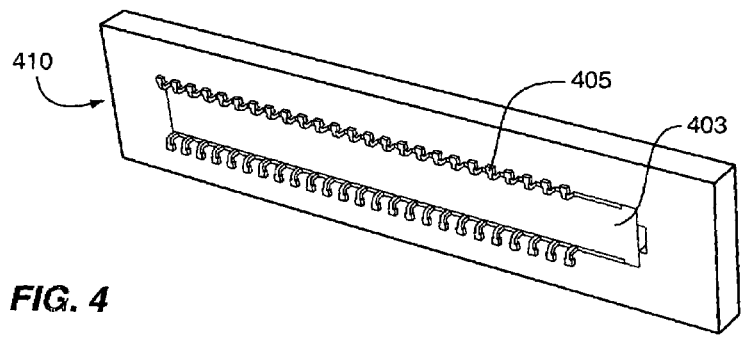

FIG. 4 illustrates a socket for mounting an integrated circuit with a power bar. In this example, the carrier 410 has two electrically conducting side panels 401 and 402 separated by a non-conductive insulation bar 403. The non-conductive insulating material may be formed from one mold or pieced together to hold the various conductive power bar carriers and pin receptacles (not shown). The electrically conducting side panels 401 and 402 are separated by insulation in order to accommodate both power and ground power plane extrusion panels 304 and 305 from a package power bar. The socket may ultimately be placed on an IC board, such as a Central Processing Unit (CPU) motherboard. As the design contemplates use in a solder-flow process used by existing technologies, such as SMT, the mounting pads 405 on the bottom of the socket are produced by known methods and are spaced as required.

Figure 5:
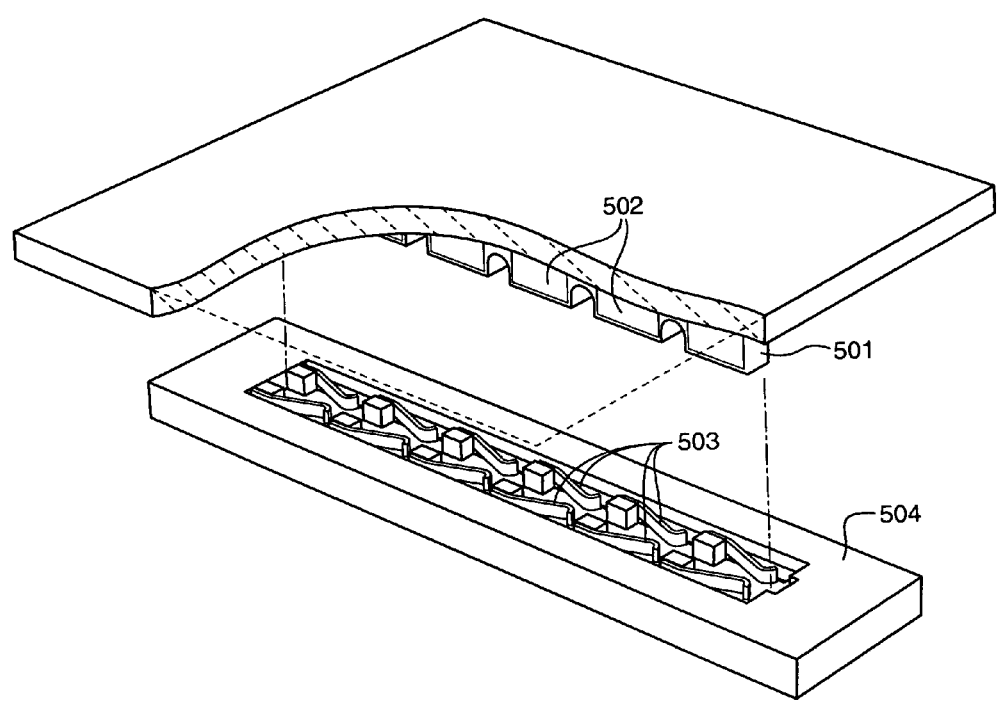
FIG. 5 illustrates how an integrated circuit package with a power bar may be mounted in a socket.

FIG. 5 illustrates how an integrated circuit package with a power bar may be mounted in a socket. The power bar 501 in this example is made of several segments 502, each designed to correspond with contact portions 503 of a carrier 504. The power bar 501 is initially set into the carrier such that it begins in a position where no contact is made. Upon sliding the power bar into position, each of the segments align with their corresponding contacts and the spring portion of the carrier's contacts apply the force necessary to establish the electrical connection.

Therefore the power bar can provide connection points for power and ground connections that are mechanically more substantial than the pins of the typical IC package as described above with reference to FIG. 1. Since these connection points are larger and stronger, they may have much more force applied to then, thereby reducing the electrical resistance of the contact. By reducing the electrical resistance of the contacts, a more uniform distribution of power can be achieved. However, the power and ground connection points are relatively far apart and the conductors carrying the current supplied by the power bar are relatively long. This distance between connection points and length of conductor increase the amount of inductance in the conductors. The present invention, as will be described below, reduces the amount of inductance in such connections by reducing the distance between the connection points and the length of the conductors.

The power bar design is not the only design to be affected by increased inductance due to a relatively large distance between the power and ground contacts and relatively long conducts for the power and ground. IC packages utilizing side terminals for supplying power and ground are likewise affected. Therefore, embodiments of the present invention are equally applicable to IC packages utilizing side terminals as well as other designs.

Figure 6A:
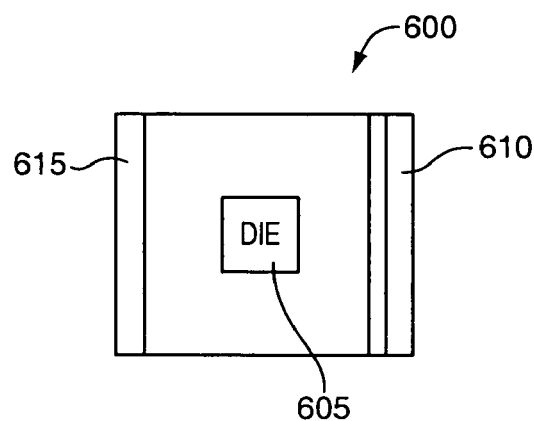
FIG. 6a is a top view of an integrated circuit package with side terminal connections.

FIG. 6a is a top view of an integrated circuit package with side terminal connections. In this example, an IC package 600 is illustrated that includes an integrated circuit die or chip 605. As with the other types of IC packages discussed above, pins (not shown) may be present to provide electrical connection points for input and output signals to and from the IC die 605. The side terminals 610 and 615, similar to the two halves of the power bar, provide connection points for power and ground being supplied to the IC die 605.

Figure 6B:
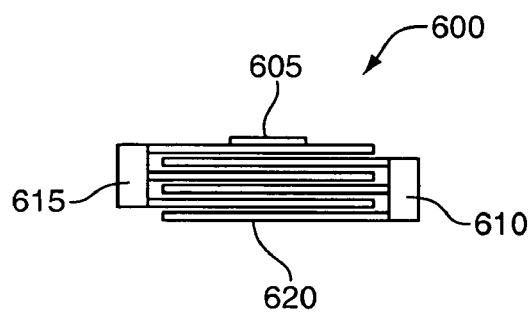
FIG. 6b is a side view of an integrated circuit package with side terminal connections.

FIG. 6b is a side view of an integrated circuit package with side terminal connections. This example illustrates the same IC package 600 including an IC die or chip 605 and side terminal connections 610 and 615. Visible from this perspective are a number of shunts 620 connected to the side terminals. These shunts 620 are used to distribute power and ground to appropriate connection points on the IC die 605.

Figure 6C:
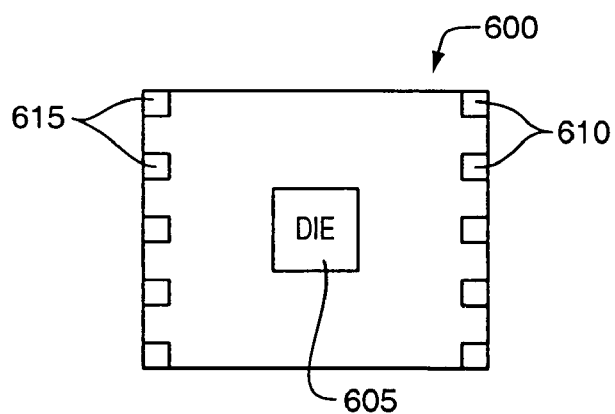
FIG. 6c is an alternative top view of an integrated circuit package with side terminals connections.

FIG. 6c is an alternative top view of an integrated circuit package with side terminals connections. In this example, an IC package 600 is illustrated that includes an IC die 605 and a number of side terminals 605 and 615. The difference here is that the side terminals 605 and 615, instead of extending the entire length of the IC package 600, are divided into a number of smaller segments. These segments 605 and 615 may be arranged so that all power terminals are on one side of the IC package 600 and all ground terminals are on the other side. Alternatively, the segments 605 and 615 may be arranged so that segments on each side provide connection points for power and ground alternately. This arrangement will be beneficial but not necessary for implementing embodiments of the present invention.

Figure 7:
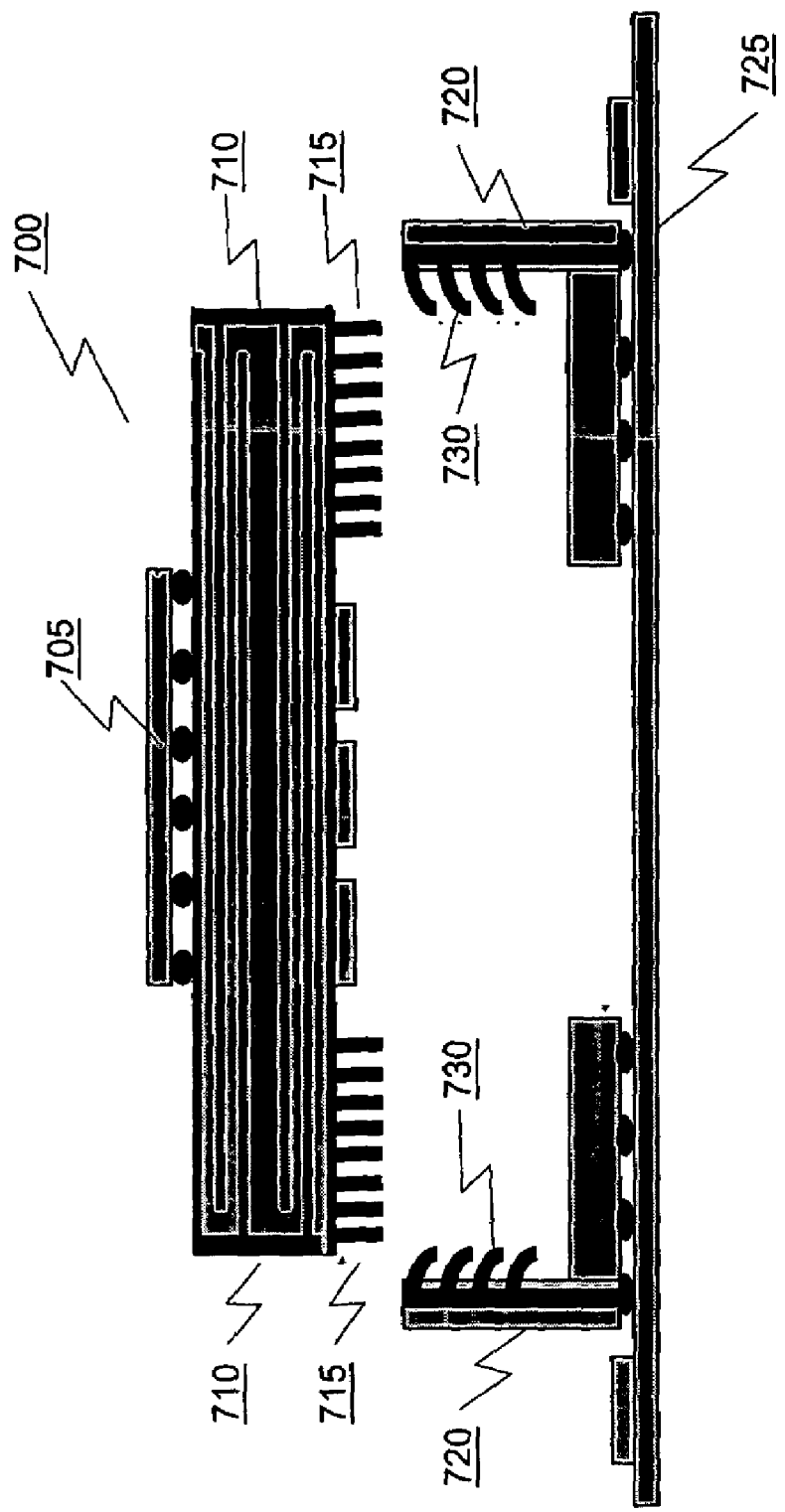
FIG. 7 is a side view illustrating how an integrated circuit package with side terminals may be mounted in a socket.

FIG. 7 is a side view illustrating how an integrated circuit package with side terminals may be mounted in a socket. This example illustrates a socket 720 mounted on a motherboard 725. An IC package 700 containing an IC chip 705, side terminals 710 and a number of pins 715 is also shown. When the IC package 700 is inserted into the socket 720, the pins 715 on the IC package 700 mate with appropriate receptacles in the socket 720 providing input and output connections for the IC chip 705. The side terminals 710 on the IC package 700 mate with terminals 730 mounted on and extending from the socket 720 to provide power and ground to the IC chip 705.

Therefore, as with the power bar, the side terminals can provide connection points for power and ground connections that are mechanically more substantial than the pins of the typical IC package as described above with reference to FIG. 1. Since these connection points are larger and stronger, they may have much more force applied to then, thereby reducing the electrical resistance of the contact. By reducing the electrical resistance of the contacts, a more uniform distribution of power can be achieved. However, the power and ground connection points are relatively far apart and the conductors carrying the current supplied by the power bar are relatively long. This distance between connection points and length of conductor increase the amount of inductance in the conductors. The present invention, as will be described below, reduces the amount of inductance in such connections by reducing the distance between the connection points and the length of the conductors.

Figure 8:
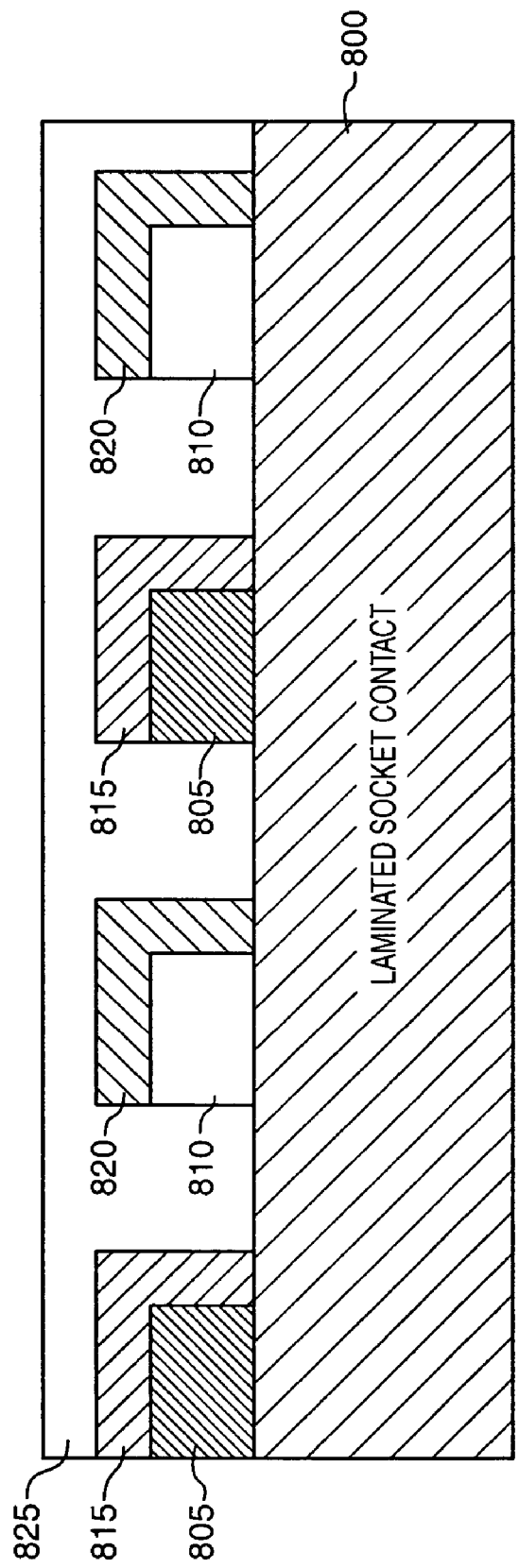
FIG. 8 is a side view illustrating a laminated socket contacting with a power bar according to one embodiment of the present invention.

FIG. 8 is a side view illustrating a laminated socket contacting with a power bar according to one embodiment of the present invention. In this example, a laminated socket contact 800 is illustrated. Additional details of this contact will be apparent in FIG. 9. FIG. 8 depicts a number of power 805 and ground 810 connections extending from the body of the contact 800. In this example, the power contacts 805 and the ground contacts 810 alternate. These power 805 and ground 810 contacts mate with corresponding terminals 815 and 820 on a power bar 825 extending from an IC package (not shown) when the IC package 825 is inserted into a socket (not shown) utilizing the laminated socket contact 800.

Figure 9:
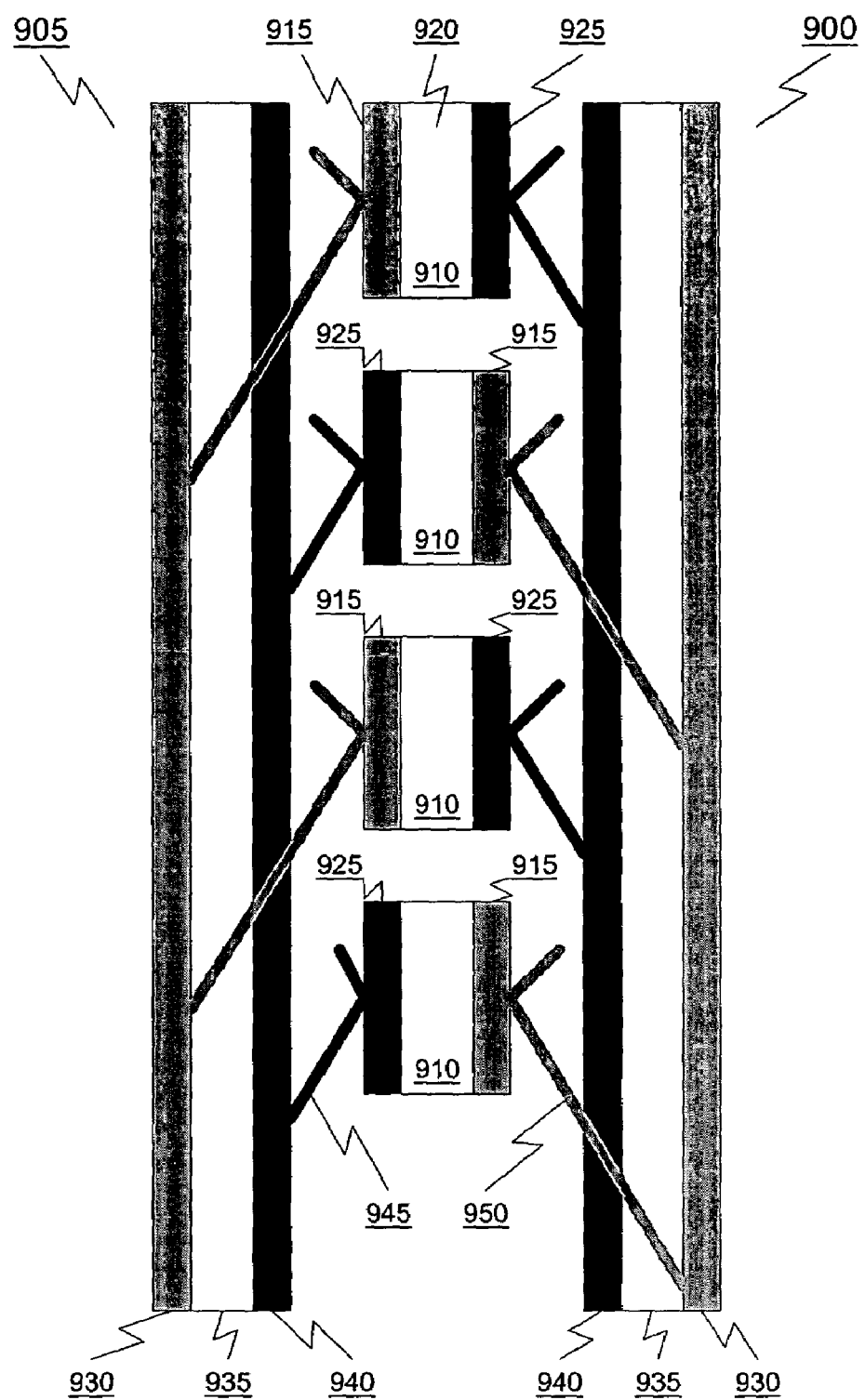
FIG. 9 is a top view illustrating a laminated socket contacting with a power bar according to one embodiment of the present invention.

FIG. 9 is a top view illustrating a laminated socket contacting with a power bar according to one embodiment of the present invention. In this view, additional details of the laminated socket contact 900 and 905 become apparent. Here, segments of a power bar 910 are illustrated. Each power bar segment 910 is made up of a ground 915 and a power 925 conductive side panel with a non-conductive insulation bar 910 between the side panels 915 and 925 as explained above. The conductive side panels 915 and 925 are arranged so that each successive power bar segment 910 has the power conductive side panel 925 and the ground conductive side panel 915 on alternate sides.

Two laminated socket contacts 900 and 905 are shown. Each laminated socket contact 900 and 905 is made up of a power panel 940 and a ground panel 930. The power panel 940 and ground panel are brought into close proximity to one another within the body of the laminated socket contact 900 and 905 but are separated from each other by a thin non-conductive layer 935. According to one embodiment of the present invention, this material may be polymer based non-conductive adhesive 2–4 mils thick. The power panel, ground panel and non-conductive layer are held together by the adhesive, which acts as the bonding material for the two metal planes and the insulation layer for the power and ground.

Extending above each power panel 940 and ground panel 930 are a number of conductive fingers 945 and 950 for engaging and electrically contacting the conductive side panels 915 and 925 of the power bar segments 910. In this configuration, the power panel 940 and ground panel 930 of the laminated socket contact 900 and 905 resemble the conducting side panels 401 and 402 of the power bar socket 410 illustrated in FIG. 4. However, the fingers 950 and 945 extending from the power panel 940 and the ground panel 930 of the laminated socket contact 900 and 905 all extend in the same direction and alternate fingers connect with power panels and ground panels, respectively. This arrangement allows for the elimination of the non-conductive insulation bar 403 illustrated in FIG. 4. The power panel 940 and ground panel 930 can then be brought into close proximity, separated only by the thin non-conductive layer 935. This reduces the distance between power and ground conductors, reduces the over length of the conductors and thereby reduces the amount of inductance through the conductors.

Figure 10:
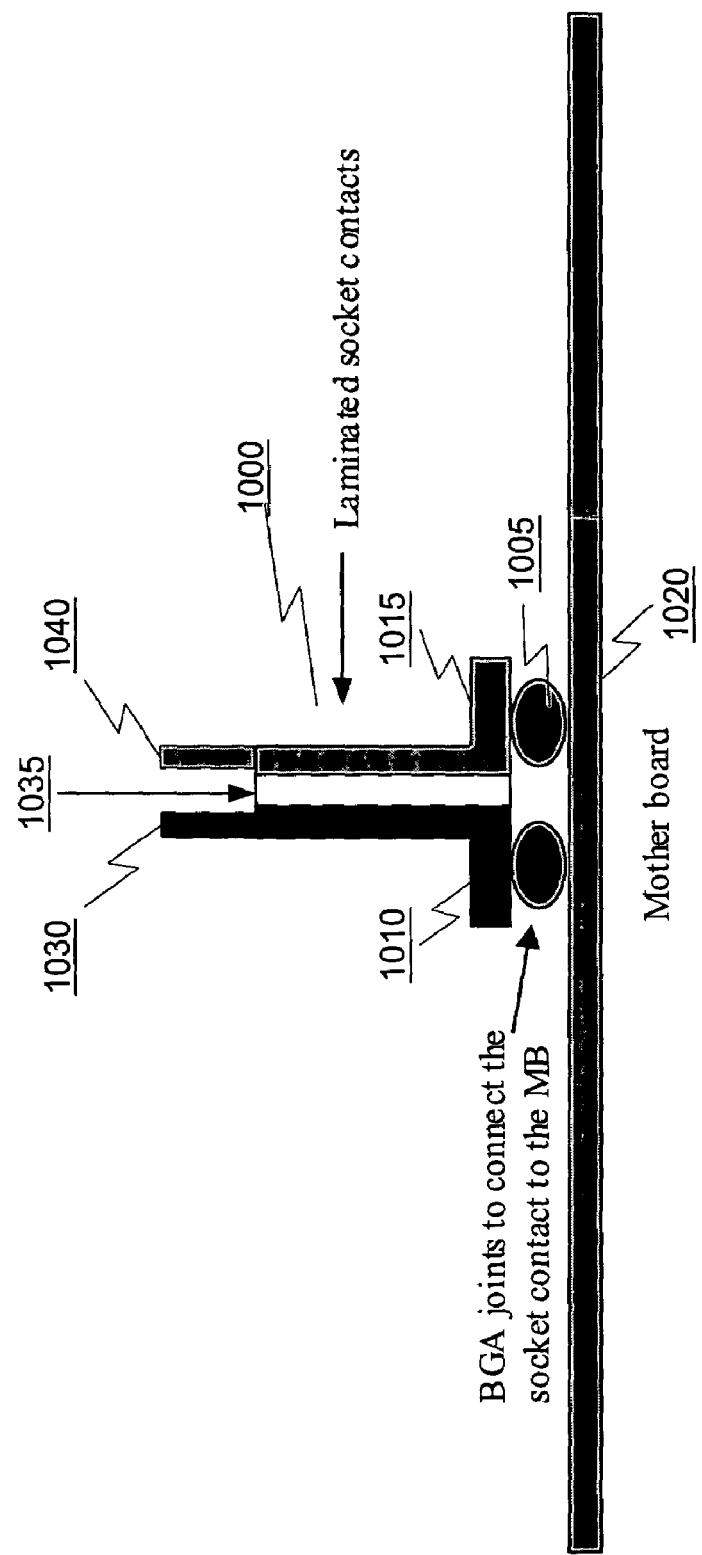
FIG. 10 is a side view illustrating a laminated socket contact with terminals for connecting to an integrated circuit package with side terminal connections according to one embodiment of the present invention.

FIG. 10 is a side view illustrating a laminated socket contact with terminals for connecting to an integrated circuit package with side terminal connections according to one embodiment of the present invention. In this example, a laminated socket contact 1000 is shown mounted on a motherboard 1020 via solder balls 1005. Alternatively, the laminated socket contact may be mounted within a socket which is in turn mounted on a motherboard.

The laminated socket contact consists of a power panel 1010 and a ground panel 1015 brought into close proximity but separated by a thin, non-conductive layer 1035. As with the laminated socket contact configured to couple with a power bar, this non-conductive layer may be made be a polymer based non-conductive adhesive 2–4 mils thick. The power panel, ground panel and non-conductive layer are held together by the adhesive, which acts as the bonding material for the two metal planes and the insulation layer for the power and ground. Extending above the laminated socket contact are a power finger 1030 and a ground finger 1040 each respectively connected to the power panel and the ground panel. These fingers provide the electrical connection to the side terminals of an integrated circuit package.

Figure 11:
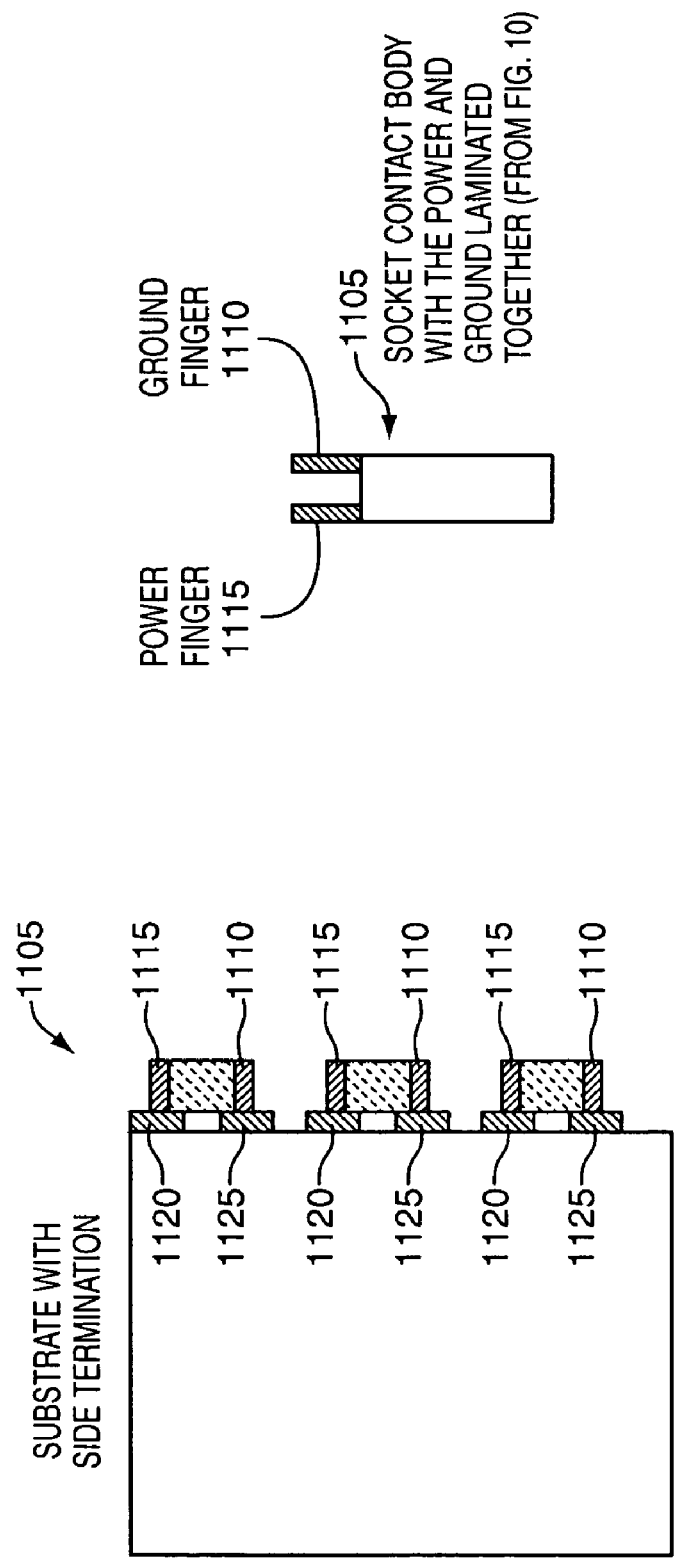
FIG. 11 is a top view illustrating a laminated socket contact connecting with an integrated circuit package having side terminal connections according to one embodiment of the present inventions.

FIG. 11 is a top view illustrating a laminated socket contact connecting with an integrated circuit package having side terminal connections according to one embodiment of the present inventions. In this example, an integrated circuit package 1100 with side terminations 1120 and 1125 is illustrated. The side terminations are arranged so that alternate terminations provide connection to power and ground, respectively. The laminated socket contacts, either mounted on a motherboard or within a socket body, are arranged so that the power fingers and grounds fingers of each laminated socket contact will connect with corresponding power and ground side terminals on the IC package when the IC package is inserted into the socket or mounted on the motherboard. This arrangement reduces the distance between power and ground conductors, reduces the over length of the conductors and thereby reduces the amount of inductance through the conductors.

What is claimed is:

1. A system, comprising:
   a printed circuit board;
   a socket mounted on the printed circuit board, the socket including
   a conductive power panel,
   a conductive ground panel,
   a thin non-conductive layer interposed between the conductive power panel and the conductive ground panel,
   a socket body encompassing the conductive power panel, the conductive
   ground panel, and the thin non-conductive layer, and
   a conductive finger extending from each of the conductive power panel and the conductive ground panel in the same direction and positioned to engage side terminals on an integrated circuit package, wherein each successive side terminal alternately is to conduct power and to ground power; and
   the integrated circuit package mounted on the socket, wherein the integrated circuit package includes an integrated circuit, wherein the integrated circuit package is connected to the side terminals, the side terminals to supply power and ground signals to the integrated circuit, wherein the side terminals include a plurality of segments, wherein each successive segment alternately contacts a power conductor and a ground conductor.

2. The system of claim 1, wherein the thin non-conductive layer comprises a polymer based non-conductive adhesive.

3. The system of claim 2, wherein the thin non-conductive layer is 2–4 rolls thick.

4. The system of claim 2, wherein the conductive power panel and the conductive ground panel are bound together by the polymer based non-conductive adhesive.

5. The system of claim 1, further comprising a plurality of conductive pin receptacles on the socket body.

6. The system of claim 1, further comprising a first plurality of conductive pins to receive input signals into the integrated circuit and a second plurality of conductive pins to provide output signals from the integrated circuit.

7. The system of claim 1, wherein the side terminations are made of copper.

8. The system of claim 1, further comprising a plurality of shunts connected to the side terminations, wherein the plurality of shunts are to distribute power and ground signals to the integrated circuit.

9. A method comprising:
   mounting a socket on a printed circuit board, the socket including a conductive power panel, a conductive ground panel, a thin non-conductive layer interposed between the conductive power panel and the conductive ground panel, a socket body encompassing the conductive power panel, the conductive ground panel, and the thin non-conductive layer, and a conductive finger extending from each of the conductive power panel and the conductive ground panel in the same direction and positioned to engage side terminals on an integrated circuit package, wherein each successive side terminal alternately is to conduct power and to ground power; and
   mounting the integrated circuit package on the socket, wherein the integrated circuit package includes an integrated circuit, wherein the integrated circuit package is connected to the side terminals, the side terminals to supply power and ground signals to the integrated circuit, wherein the side terminals include a plurality of segments, wherein each successive segment alternately contacts a power conductor and a ground conductor.

10. The method of claim 9, wherein the thin non-conductive layer comprises a polymer based non-conductive adhesive.

11. The method of claim 10, wherein the non-conductive layer is 2–4 mils thick.

12. The method of claim 10, wherein the conductive power panel and the conductive ground panel are bound together by the polymer based non-conductive adhesive.

13. The method of claim 9, further comprising a plurality of conductive pin receptacles on the socket body.

14. The method of claim 9, further comprising a first plurality of conductive pins to receive input signals into the integrated circuit and a second plurality of conductive pins to provide output signals from the integrated circuit.

15. An apparatus comprising:
    a printed circuit board;
    a socket mounted on the printed circuit board, the socket including
    a conductive power panel,
    a conductive ground panel,
    a thin non-conductive layer interposed between the conductive power panel and the conductive ground panel,
    a socket body encompassing the conductive power panel, the conductive
    ground panel, and the thin non-conductive layer, and
    a conductive finger extending from each of the conductive power panel and the conductive ground panel in the same direction and positioned to engage side terminals on an integrated circuit package, wherein each successive side terminal alternately is to conduct power and to ground power; and
    the integrated circuit package mounted on the socket, wherein the integrated circuit package includes an integrated circuit, wherein the integrated circuit package is connected to the side terminals, the side terminals to supply power and ground signals to the integrated circuit, wherein the side terminals include a plurality of segments, wherein each successive segment alternately contacts a power conductor and a ground conductor.

16. The apparatus of claim 15, wherein the non-conductive layer comprises a polymer based non-conductive adhesive.

17. The apparatus of claim 16, wherein the non-conductive layer is 2–4 mils thick.

18. The apparatus of claim 16, wherein the conductive power panel and the conductive ground panel are bound together by the polymer based non-conductive adhesive.

* * * * *

UNITED STATES PATENT AND TRADEMARK OFFICE
CERTIFICATE OF CORRECTION

PATENT NO. : 6,979,208 B2 Page 1 of 1
APPLICATION NO. : 10/922581
DATED : December 27, 2005
INVENTOR(S) : Xie et al.

It is certified that error appears in the above-identified patent and that said Letters Patent is hereby corrected as shown below:

In column 7, at line 45, delete "rolls" and insert --mils--.

Signed and Sealed this

Second Day of September, 2008

JON W. DUDAS
*Director of the United States Patent and Trademark Office*